United States Patent
Pradal

[11] 4,072,912
[45] Feb. 7, 1978

[54] NETWORK FOR TEMPERATURE COMPENSATION OF AN AT CUT QUARTZ CRYSTAL OSCILLATOR

[75] Inventor: Bortolo Mario Pradal, Pittsburgh, Pa.

[73] Assignee: RCA Corporation, New York, N.Y.

[21] Appl. No.: 741,405

[22] Filed: Nov. 12, 1976

[51] Int. Cl.² .......................... H03B 5/04; H03B 5/32
[52] U.S. Cl. ................................ 331/116 R; 331/158; 331/176
[58] Field of Search ...................... 331/176, 66, 116 R, 331/158–164

[56] References Cited

U.S. PATENT DOCUMENTS

| | | | |
|---|---|---|---|
| 3,200,349 | 8/1965 | Bangert | 331/176 X |
| 3,523,258 | 8/1970 | Niemoeller et al. | 331/116 R |
| 3,531,739 | 9/1970 | Groves | 331/176 X |

Primary Examiner—Siegfried H. Grimm
Attorney, Agent, or Firm—Eugene M. Whitacre; Paul J. Rasmussen; Robert L. Troike

[57] ABSTRACT

A network for temperature compensation of a crystal oscillator over an extended temperature range encompassing two points of inflection of the drift characteristic of an AT cut crystal. The oscillator is of the type having, in loop connection, an AT cut quartz crystal and a voltage variable capacitance device. The compensation network utilizes a three resistor, three thermistor electrical network for generating a temperature dependent bias voltage applied to the variable capacitance device to compensate for changes in the self-resonant frequency of the crystal due to temperature variation. A method for determining the component values for the compensation network is also disclosed.

9 Claims, 3 Drawing Figures

NETWORK FOR TEMPERATURE COMPENSATION OF AN AT CUT QUARTZ CRYSTAL OSCILLATOR

BACKGROUND OF THE INVENTION

1. Field of the Invention

The present invention relates to temperature compensation of quartz crystal oscillators.

2. Description of the Prior Art

Crystal oscillators generally comprise a resonant circuit, including a crystal and a load capacitance, and means, such as an amplifier, for supplying energy to the resonant circuit to make up for losses and so sustain oscillations in the resonant circuit. The crystal load capacitance conventionally is adjustable typically including a voltage-controlled-capacitance device such as a varactor diode, to provide for adjustment of the resonant frequency of the circuit.

Quartz crystals of the AT cut type are widely used in crystal oscillators. The self-resonant frequency of such AT cut crystals, however, varies in accordance with changes in temperature. The self-resonant frequency versus temperature characteristic of AT cut crystals is dependent on the relative position of the parallel surfaces of the quartz crystal with respect to the crystallographic axes of the quartz, and is expressed as a third degree polynominal such as follows:

$$\Delta F = [A_o \Delta T + B_o T^2 + C_o \Delta T^3] F_R \quad (1)$$

where $F_R$ is the self-resonant frequency of the crystal at a reference temperature $T_R$, $\Delta F$ is equal to the self-resonant frequency excursion with respect to $F_R$ of the crystal at the instantaneous temperature $T$ and $\Delta T$ is the temperature excursion from the reference temperature to the instantaneous temperature. Reference temperature $T_R$ is generally taken to be 26° C for an AT cut crystal. Coefficients $A_o$, $B_o$ and $C_o$ are dependent upon the relative position of the parallel surfaces of the particular crystal with respect to the crystallographic axis of the quartz, and in particular, with respect to the "Z" or optical axis of the quartz.

Compensation for change in self-resonant frequency due to temperature change, hereinafter referred to as "frequency drift," is generally accomplished by varying the crystal load capacitance, i.e., the capacitance across the crystal, in a predetermined manner. The change in crystal load capacitance is typically effected by application of a temperature-dependent biasing voltage to a voltage-controlled capacitance device. In the prior art, however, full compensation of the drift characteristics of AT crystals have been limited to crystals with temperature drift characteristics having only one point of inflection within the operating temperature range, and utilize compensation networks having a large number of components. Further, the prior art compensation networks have typically neglected the second order term in the crystal drift characteristic equation. The temperature dependent bias signal is typically produced by a temperature-dependent potential-dividing network, a bridge network utilizing a plurality of variable-capacitance devices, or both. Examples of such prior art are described in U.S. Pat. Nos. 3,054,966 issued Sept. 18, 1962 to R. Etherington; 3,409,841 issued Nov. 5, 1968 to R. Munn; 3,525,055 issued Aug. 18, 1970 to P. Mrozek; and 3,581,239 issued May 25, 1971 to W. Knutson.

Summary of the Invention

The present invention is directed to an improvement in a three-terminal temperature-compensation network of the type that functions as a temperature-dependent potential-dividing means. In such a network fixed-value bias potential applied to first and second terminals is divided by a temperature-dependent factor to provide the temperature-dependent bias signal between the second terminal and a third terminal. The potential dividing means comprises first, second, third, fourth, fifth and sixth resistances. The temperature coefficient of the first, second and third resistances are substantially zero; causing the resistances to remain substantially constant despite temperature change and the temperature coefficients of the fourth, fifth and sixth resistances are negative temperature coefficients causing the resistances to decrease and increase, respectively, as temperature increases or decreases. The first and fourth resistances are connected in parallel combination and the parallel combination is, in turn, serially coupled with the second resistance between the first and second terminal of the divider means. The third and fifth resistances are connected in serial combination between the second and third terminals and so is the sixth resistance.

Description of a Preferred Embodiment

Figure 1:
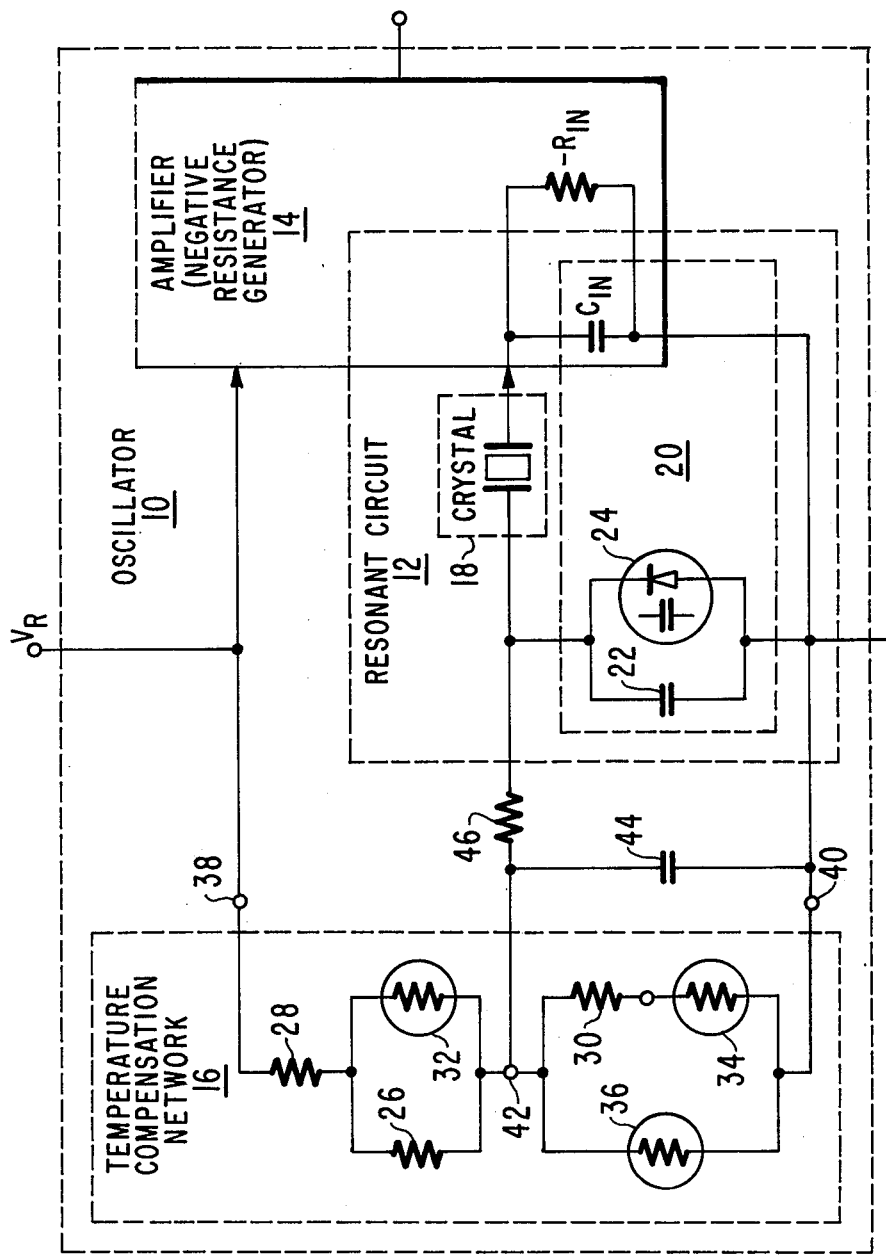
FIG. 1 is a block schematic diagram of a temperature-compensated oscillator embodying the present invention.
Figure 1A:
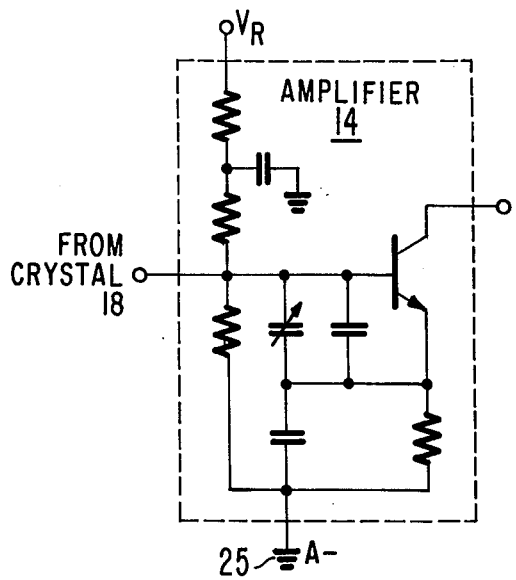
FIG. 1A is a schematic diagram of a suitable amplifier for use in the oscillator of FIG. 1.

Referring now to FIG. 1, there is shown a temperature-compensated oscillator 10 comprising a resonant circuit 12, an amplifier 14, and a temperature-compensation network 16 used for compensating the oscillator against changes in frequency due to changes in temperature. Amplifier 14 is preferably a negative resistance generator, having a predetermined input capacitance $C_{in}$, for example, a 45 picofarads. Amplifier 14 is utilized to provide a negative resistance -R in parallel with input capacitance $D_{in}$, to sustain oscillation in resonant circuit 12. A suitable amplifier for providing a negative resistance is depicted in FIG. 1A.

Figure 2:
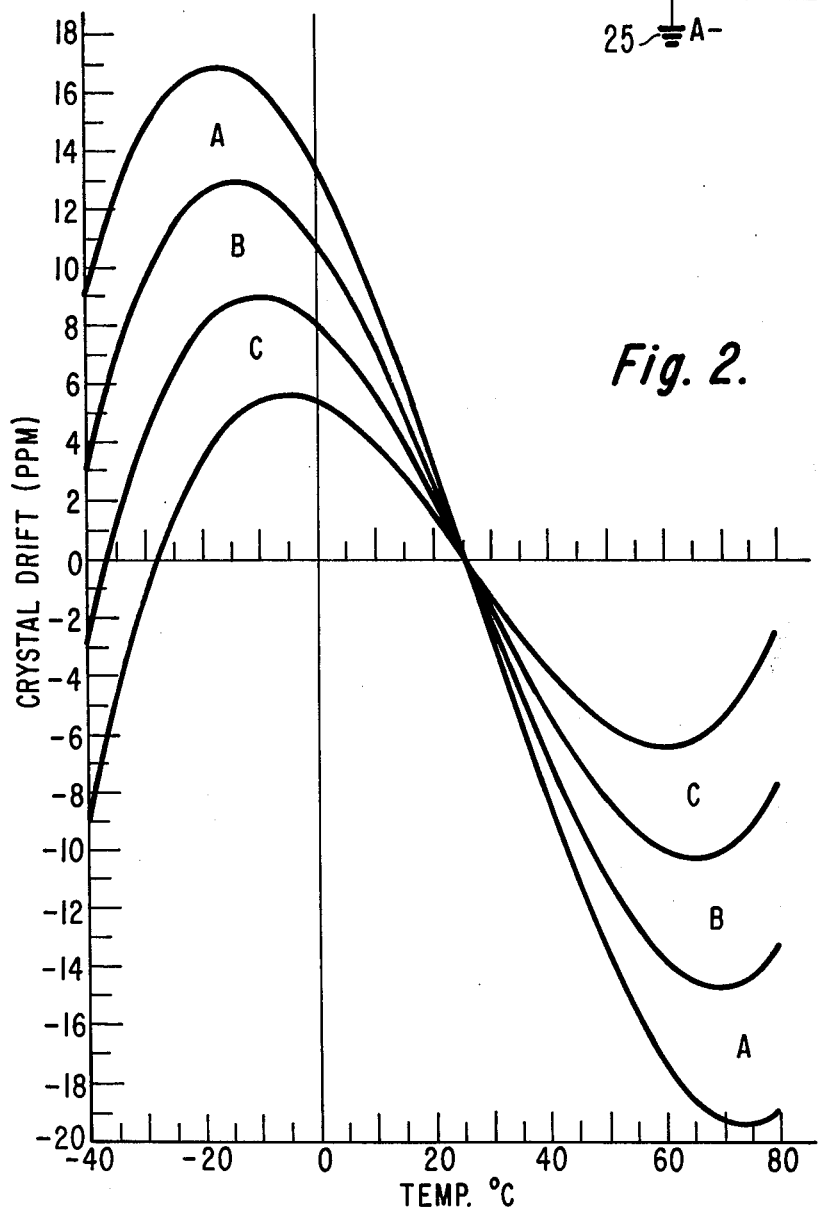
FIG. 2 is a graph of a family of frequency drift characteristics for AT cut crystals.

Resonant circuit 12 comprises an AT crystal 18 and a voltage-controlled crystal load capacitance 20. Load capacitance 20 typically comprises a fixed capacitance 22 coupled in parallel with a voltage-controlled-capacitance device such as a varactor diode, the parallel combination being serially connected with the input capacitance $C_{in}$ of amplifier 14. Crystal 18 is a two terminal AT cut crystal, having a self-resonant frequency which varies (drifts) with change in temperature in accordance with equation 1. A representative family of frequency drift characteristics for such a crystal is shown in FIG. 2. One terminal of crystal 18 is coupled to amplifier 14. The other terminal of crystal 18 is coupled through capacitances 22 and 24 to a ground potential, generally indicated as 25. Resonant circuit 12 is resonant at a frequency, F, determined by the instantaneous self-resonant frequency of crystal 18 and the instantaneous value of load capacitance 20

$$F = \frac{1}{2\pi \sqrt{L_m C_m}} (1 + \frac{C_m}{2(C_L + C_o)}) \quad (2)$$

where $C_L$ is the value of load capacitance 20, $L_m$, $C_m$ and $C_o$ are respectively the motional inductance, the motional capacitance and shunt capacitance of crystal 18. Temperature compensation network 16, which is constructed in accordance with the present invention, comprises first, second, third, fourth, fifth and sixth resistances, respectively designated as 26, 28, 30, 32, 34 and 36, and first, second and third terminals, respectively designated 38, 40 and 42. Resistances 26, 28 and 30 are resistors with temperature coefficients substantially equal to zero. Resistances 32, 34 and 36 are thermistors with negative temperature coefficients. A fixed regulated bias potential, $V_R$, is applied at first terminal 38 and second terminal 40 is coupled to ground potential 25. Resistor 26 and thermistor 32 are connected in parallel combination, and the parallel combination is serially coupled with resistor 28 between first and third terminals 38 and 42. Resistor 30 and thermistor 34 are serially connected between second terminal 40 and third terminal 42. Also connected between terminal 40 and 42 are respectively thermistor 36, and a by-pass capacitor 44. Terminal 42 is additionally connected through a resistor 46 to the juncture between crystal 18 and load capacitance 20. Resistor 46 co-operates with by-pass capacitor 44 to prevent RF signals existing across capacitors 22 and 24 from being applied to compensation network 16.

In theory, to obtain perfect compensation against temperature-dependent frequency drift in the output signal of resonant circuit 12, one must arrange to apply to varactor diode 24 a bias signal of amplitude $V_T$, defined per equation (3), following $$V_{(T)} = V_R - [(A_o \Delta T + B_o \Delta T^2 + C_o \Delta T^3)/S] \quad (3)$$

where $V_R$ is the fixed bias potential in volts applied to terminal 38 at the reference temperature $T_R$ and $S$ is the frequency deviation sensitivity, in ppm per volt, of oscillator 10 (assumed to have a constant rate of change per unit of voltage). Thus, the amplitude of the compensation signal may be expressed as an equation of the form:

$$V_{(T)} = A_1 \Delta T - B_1 \Delta T^2 - C_1 \Delta T^3 \quad (4)$$

The coefficients $A_1$, $B_1$, $C_1$ reflect scaling due to the sensitivity (change in frequency per volt) of resonant circuit 12. The compensation voltage changes the capacitance of varactor 24 to produce a tendency towards change in the resonant frequency of resonant circuit 12 equal in magnitude but opposite in sense to the tendency towards change in the resonant frequency caused by the temperature-dependency of crystal 18.

It is desirable to maintain constant oscillator frequency over a large range of temperature change, (e.g., from −40° to +85° C). Over so large a temperature range, the drift characteristic of many AT-cut crystals, such as those illustrated in FIG. 2 have two points in inflection. Accordingly, the wave form of compensation biasing voltage $V_T$ must be made to have two points of inflection to effect good temperature compensation. To get good temperature compensation it has been determined that it is desirable that the compensation voltage for such crystals exactly match the desired voltage function of equation 4 at least at five predetermined temperatures. Based on algebraic consideration one would be led to believe that at least one temperature-dependent resistance is required for every temperature at which the compensation voltage is to be matched to equation (4). Further one would expect values of such resistances to be unique for each particular drift characteristic one expects to be able to compensate.

The present inventor has found, however, that the desired compensation biasing voltage function can be matched at five predetermined temperatures with a network comprising only three resistors and three thermistors. The ratio of the resistance of thermistors 34 and 36 at the reference temperature and the ratio of the resistances of the resistor 30 and thermistor 34 are utilized as fourth and fifth variables to achieve matching at fourth and fifth temperature points. Temperature compensation network 16 generates a biasing voltage $V_B$ between terminals 40 and 42 in accordance with the following equation $$V_B(T) = \left[ \frac{\frac{[R_3 + R_5(T)] R_6(T)}{R_3 + R_5(T) + R_6(T)}}{R_2 + \frac{R_1 R_4(T)}{R_1 + R_4(T)} + \frac{R_6(T)[R_3 + R_5(T)]}{R_3 + R_5(T) + R_6(T)}} \right] V_R \quad (5)$$

Where $R_1$, $R_2$, $R_3$, $R_4(T)$, $R_5(T)$, $R_6(T)$ represent the respective values of the resistances 26, 28, 30, 32, 34 and 36 at temperature T.

To derive values for these resistances, the sensitivity ($\Delta F/\Delta V$) and frequency drift of resonant circuit 12, at each of the predetermined temperatures where temperature compensation is to be perfect is measured. The biasing voltage necessary to compensate for the frequency drift at each predetermined temperature is calculated. It should be noted, frequency drift characteristics as defined in equation 1 depicted in FIG. 2, have two distinct points of inflection within a range of temperature −40° to +80° C, one below and the other above the reference temperature $T_R$ (approximately 26° C). Once all the voltages $V_{(T)}$ required to perfectly compensate the crystal frequency drift have been determined the characteristic equation of $V_{(T)}$ can be synthesized and from it the points of inflection be calculated by differentiating the polynominal expressing $V_{(T)}$, per equation (4) and equating the result to zero. It can be shown that minimization of the error associated with compensation is achieved, when a reduced number of elements in the temperature compensation network, only where the compensation network voltage function to be synthesized has points of inflection at the same temperature as does the frequency drift characteristic of the crystal. Utilizing the calculated compensation voltages at the predetermined temperatures, the inflection point temperature derivatives a system of equations can be set up from which values for resistances in network 16 may be computed. The resistance computed from the system of equations, however are not always realizable with passive elements.

In a large scale production environment it is usually impractical to maintain an inventory of thermistors having a large number of differing values. Accordingly, in accordance with a further aspect of the present invention, in a production environment, specific thermistors of predetermined nominal value are chosen for use as thermistors 32, 34 and 36. The thermistors are contained within a unitary package including resonant circuit 12 and amplifier 14. Connecting pins in the package provide for resistors 26, 28 and 30 to be located outside the package and yet be connected into compensation network 16. A plurality of oscillators 10 are inserted in a testing tray, each including a temperature compensation network 16 utilizing thermistors 32, 34 and 36 of predetermined nominal value and dummy resistors of predetermined value within ± 0.1% to simulate resistors 26, 28 and 30. As will be explained, the nominal values of thermistors 34 and 36 are fixed for a given family of drift characteristics and the nominal value of thermistor 32 is chosen in accordance with the manufacturer's categorization of the particular crystal 18. The value of the dummy resistors are fixed, but are chosen to have nominal values typically necessary to compensate a crystal in the middle of the family of characteristics of crystal 18. The testing tray is inserted into a temperature-controlled oven. At each of five predetermined temperatures, the voltages at the juncture between thermistor 34 and resistor 30, at terminal 42, at the juncture between resistor 26 and 28, and at terminal 38 in each of the respective temperature compensation networks 16 are sequentially measured. Note the external connecting pins for resistors 26–30 facilitate such measurements. The output frequency of each resonant circuit 12 is also measured at each chosen predetermined temperature. From such measurements the exact individual resistance values and coefficients of temperature of thermistors 32, 34 and 36, at each temperature are calculated. At each temperature, three predetermined voltages are sequentially applied from, for example, a low internal resistance programmable DC power supply, to terminal 42 of each temperature compensation network and the output frequencies of oscillator 10 corresponding to the respective voltages are measured. The sensitivity (ΔF/ΔV) of oscillator 10 is calculated proceeding from these measurements. The deviations of the frequency of oscillator 10 from its frequency at the reference temperature (approximately 26° C) with the middle voltage of the three sequentially applied voltages being applied to terminal 42, and the voltages required at the predetermined temperatures to compensate for such frequency drifts are then calculated. From the calculated voltages the characteristic equation of the total voltage curve is derived, and differentiated to determine the points of inflection. It should be appreciated that such calculated drift characteristics and sensitivities take into account not only the crystal drift, but also other frequency drifts in oscillator 10 arising from other sources such as component value temperature drift.

A system of equations is then set up for each oscillator 10 utilizing the respective measured compensation voltages at three of the matching temperatures, for example, at −40°, −10° and 65° C and the point of inflection temperatures. Solution of such a system of equations generally will provide realizable values for resistances 26 and 28 for a given value of resistance 30. In addition, a desired value for thermistor 32 may also be calculated.

As noted above, the nominal value of thermistor 32 is chosen in accordance with the crystal manufacturers categorization of crystal 18. The crystal manufacturer categorizes crystal 18 in accordance with its nominal drift characteristic. For example, crystals with characteristics such as illustrated in FIG. 2, are suitably classified in three groups, denoted A, B and C. The nominal value of thermistor 32 is chosen in accordance with the classification of the particular crystal 18, calculated for compensation of a crystal having a drift characteristic in the center of the particular category. It has been discovered in the present invention that even if the measured resistance of thermistor 32 differs as much as 15% from the calculated desired value, a voltage function and corresponding frequency function that is substantially parallel, with, but offset from, the desired compensation function is realizable. To compensate for the offset, the output frequency of oscillator 10 is adjusted, at the reference temperature (26° C), by an amount equal and opposed to the frequency offset. Where the predetermined temperatures are chosen to include the extremes of the operating temperature range, for example −40 and +80° C., a midpoint near the center of the temperature range, for example 26° C, the temperatures approximately midway between the extreme and middle temperatures, for example −10° and +65° C, a deviation from the desired voltage function of only approximately 5 millivolts can be achieved.

Since only the values of thermistors 32, 34 and 36 are temperature-dependent, solution of the above described system of equations, while providing realizable values for resistances 26, 28 and 32, will only match the biasing voltage to the desired compensation voltage function at three of the five predetermined temperatures.

However, the ratio of values of thermistor 34 and resistor 30 provide a further temperature dependent variable to approximate closely, within 5 millivolts, the function at a fourth temperature. The value of resistor 30 is preferably initially that value which, in combination with the measured values of thermistors 32, 34 and 36, provide real and positive values for resistors 26 and 28 to match the compensation voltage function at the lowest and inflection point predetermined temperatures. While the ratio of the values of thermistors 34 and 36 can provide a fifth temperature dependent variable, as noted above, the adjustment of the ratio of the values of thermistors 34 and 36 is not practical for each individual oscillator 10 in a production environment. Thus, in choosing nominal values of thermistors 34 and 36 a ratio of values nominally equal to a predetermined middle value, is utilized for all crystals having a frequency drift characteristic within a given family of characteristics. For example, a nominal ratio of five is utilized with crystals 18 having a drift characteristic such as depicted in FIG. 2. The ratio of the values of thermistors 34 and 36 is a different value for other families of curves. Since the ratio of thermistors 34 and 36 are fixed, as a practical matter, by the measured value of the two thermistors chosen for the individual oscillators, the compensation voltage function can theoretically be matched at only four of the five predetermined temperatures. However, temperature compensation network 16 can be value optimized to minimize compensation error at the fifth predetermined temperature, at the expense of voluntary introduction of small compensation errors at the other four temperatures, by iteratively adjusting the value of the resistor 28 to minimize the error at the fifth temperature. Similarly, the value of resistors 26 and 30 may be iteratively adjusted to minimize the voltage function approximation error at all five temperatures. It was found that by this process, the compensating voltage function could be optimized to within ± 25 millivolts for the FIG. 2 family of characteristics, which when the frequency deviation sensitivity is chosen to be 20 ppm/volt, correspond to a maximum error, or deviation from perfect compensation, of ± 0.5 ppm.

Oscillators employing an AT crystal and a three thermistor, three-resistor compensation network have been operated over a range of temperature from −40° to +85° C and have demonstrated a frequency stability of within ± 0.5 parts per million.

What is claimed is:

1. In a crystal oscillator of the type including a resonant circuit and means for sustaining oscillations in said resonant circuit, said resonant circuit including in loop connection a voltage variable capacitance device and a crystal, said crystal having a temperature dependent self-resonant frequency, and a predetermined frequency drift characteristic, said oscillator further including means for generating a bias signal having an aplitude varying in accordance with temperature, said bias signal being applied to said voltage variable capacitance device to vary the capacitance of said device to compensate for temperature dependent changes in said crystal self-resonant frequency, said bias signal matching a predetermined theoretical compensation voltage versus temperature curve at a plurality of predetermined temperatures within a predetermined range of temperatures, said means for generating said bias signal comprising a temperature dependent potential dividing network means, responsive to a fixed bias potential applied across first and second terminals, for providing said bias signal between said second terminal and a third terminal, the improvement wherein:

said crystal has a frequency drift characteristic approximately in accordance with an equation of the third degree in temperature change having upper and lower inflection points within said predetermined range of temperatures; and said temperature dependent potential dividing means comprises first, second, third, fourth, fifth and sixth resistances, said first, second and third resistances exhibiting substantially zero temperature coefficients and said fourth, fifth and sixth resistance exhibiting predetermined negative temperature coefficients;

a parallel connection of said first and said fourth resistances;

said parallel connection being serially coupled with said second resistance between said first and third terminals;

said third and said fifth resistances being serially coupled between said second and third terminals; and said sixth resistance being coupled between said second and third terminals.

2. An improved oscillator as set forth in claim 1 wherein:

the ratio of said third and fifth resistances is equal to the first predetermined value, and the ratio of said fifth and sixth resistances are equal to a second predetermined value.

3. An improved oscillator as set forth in claim 1 wherein said first, second, third, fourth, fifth and sixth resistances are substantially equal to those as would be determined by employing a method of determining these resistances comprising the steps of:

a. constructing a circuit in accordance with claim 1, utilizing first, second and third resistances of known value and fourth, fifth and sixth resistances of predetermined nominal value and temperature coefficient, said known value resistances being detachably connected into said circuit:

b. sequentially bringing said constructed circuit to each of said plurality of predetermined temperatures;

c. applying a predetermined bias potential at said first terminal and respectively measuring, at each of said predetermined temperatures, the potential with respect to ground potential at said first and third terminals, and at the respective junctures between the first and second resistances and between said third and fifth resistances;

d. calculating from said measured potentials the actual values of said fourth, fifth and sixth resistances;

e. at each of said temperatures, applying at least three voltage levels to said third terminal and measuring the corresponding output frequencies of said oscillator;

f. calculating, from said measured frequencies, the frequency drift and sensitivity of said oscillator at each of said temperatures;

g. calculating, from said frequency drifts and said sensitivities, the respective values of said biasing voltage required to match said theoretical compensation voltage at said predetermined temperatures;

h. deriving from said calculated biasing voltages the points of inflection of said oscillator frequency drift characteristic and calculating the biasing voltage required to match said theoretical curve at said inflection points;

i. calculating from said required biasing voltages and said actual values of said fourth, fifth and sixth resistances, values for said first, second and third resistances to provide said required biasing voltages at three of the group of temperatures consisting of said predetermined temperatures and inflection point temperatures; and j. iteratively adjusting said calculated values of said first, second and third resistances such that said circuit generates said required biasing voltages at further of said group of temperature.

4. A method for use in conjunction with the improved oscillator of claim 1, for choosing values for said resistances to generate a bias signal to compensate for temperature-dependent changes in the self-resonant frequency of a particular crystal, comprising the steps of a. constructing a circuit in accordance with claim 1, utilizing first, second and third resistances of known value and fourth, fifth and sixth resistances of predetermined nominal value and temperature coefficient, said known value first, second and third resistances being detachably connected into said circuit;

b. sequentially bringing said constructed circuit to each of said plurality of predetermined temperatures;

c. applying a predetermined bias potential at said first terminal and respectively measuring, at each of said predetermined temperatures, the potential with respect to ground potential at said first and third terminals, and at the respective junctures between the first and second resistances and between said third and fifth resistances;

d. at each of said temperatures, applying at least three voltage levels to said third terminal and measuring the corresponding output frequencies of said oscillator;

3. calculating from said measured frequencies and voltages, the respective actual values of said fourth, fifth and sixth resistances, the actual frequency drift characteristics and sensitivity of said oscillator and values for said first second and third resistances required to match said biasing voltage to said theoretical curve at said predetermined temperatures.

5. The method of claim 4 wherein said calculating step (e) comprises the steps of
   f. calculating, from said measured frequencies, the frequency drift and sensitivity of said oscillator at each of said temperatures;
   g. calculating, from said frequency drifts and said sensitivities, the respective values of said biasing voltage required to match said theoretical compensation voltage at said predetermined temperatures;
   h. deriving from said calculated biasing voltages the points of inflection of said oscillator frequency drift characteristic and calculating the biasing voltages required to match said theoretical curve at said inflection points;
   i. calculating from said calculated biasing voltages, and said measured values of said fourth, fifth and sixth resistances, values for said first, second and third resistances.

6. The method of claim 5 wherein said calculating step (e) further includes the step of
   j. iteratively adjusting the ratio of said third and fifth resistances and repeating step i until the value of said biasing voltage matches said theoretical value at a further temperature point.

7. The method of claim 6 further including the step of:
   k. iteratively adjusting said first, second and third resistances in small increments until the biasing voltage is substantially matched to said theoretical compensation voltage at all said predetermined temperatures.

8. In a crystal oscillator of the type including a resonant circuit and means for sustaining oscillations in said resonant circuit, said resonant circuit including a loop connection a voltage variable capacitance device and a crystal, said crystal having a temperature dependent self-resonant frequency, and a predetermined frequency drift characteristic, said oscillator further including means for generating a bias signal having an amplitude varying in accordance with temperature, said bias signal being applied to said voltage variable capacitance device to vary the capacitance of said device to compensate for temperature dependent changes in said crystal self-resonant frequency, said bias signal matching a predetermined theoretical compensation voltage versus temperature curve at a plurality of predetermined temperatures, the improvement wherein:

said crystal has a frequency drift characteristic approximately in accordance with an equation of the third degree in temperature change having upper and lower inflection points within a predetermined range of temperatures; and said plurality of predetermined temperatures include temperatures substantially equal to said inflection point temperatures, the upper and lower temperatures of said range of temperatures and a temperature approximately in the middle of said range of temperatures, said means for generating said bias signal comprising a temperature dependent potential dividing network means, responsive to a fixed bias potential applied across first and second terminals, for providing said bias signal between said second terminal and a third terminal, said temperature dependent potential dividing means comprises first, second, third, fourth, fifth and sixth resistances, said first, second and third resistances exhibiting substantially zero temperature coefficients and said fourth, fifth and sixth resistances exhibiting predetermined negative temperature coefficients;

a parallel connection of said first and said fourth resistances;

said parallel connection being serially coupled with said second resistance between said first and third terminals;

said third and said fifth resistances being serially coupled between said second and third terminals, and said sixth resistance being coupled between said second and third terminals.

9. An improved oscillator as set forth in claim 8 wherein said first, second, third, fourth, fifth and sixth resistances are substantially equal to those as would be determined by employing a method of determining these resistances comprising the steps of:
   a. constructing a circuit in accordance with claim 1, utilizing first, second and third resistances of known value and fourth, fifth and sixth resistances of predetermined nominal value and temperature coefficient, said known value resistances being detachably connected into said circuit;
   b. sequentially bringing said constructed circuit to each of said plurality of predetermined temperatures;
   c. applying a predetermined bias potential at said first terminal and respectively measuring, at each of said predetermined temperatures, the potential with respect to ground potential at said first and third terminals, and at the respective junctures between the first and second resistances and between said third and fifth resistances;
   d. calculating from said measured potentials the actual values of said fourth, fifth and sixth resistances;
   e. at each of said temperatures, applying at least three levels to said third terminal and measuring the corresponding output frequencies of said oscillator;
   f. calculating, from said measured frequencies, the frequency drift and sensitivity of said oscillator at each of said temperatures;
   g. calculating, from said frequency drifts and said sensitivities, the respective values of said biasing voltage required to match said theoretical compensation voltage at said predetermined temperatures;
   h. deriving from said calculated biasing voltages the points of inflection of said oscillator frequency drift characteristic and calculating the biasing voltages required to match said theoretical curve at said inflection points;
   i. calculating from said required biasing voltages and said actual values of said fourth, fifth and sixth resistances, values for said first, second and third resistances to provide said required biasing voltages at three of the group of temperatures consisting of said predetermined temperatures and inflection point temperatures; and
   j. iteratively adjusting said calculated values of said first, second and third resistances such that said circuit generates said required biasing voltages at further of said group of temperature.

* * * * *

UNITED STATES PATENT OFFICE
CERTIFICATE OF CORRECTION

PATENT NO. : 4,072,912

DATED : February 7, 1978

INVENTOR(S) : Bortolo Mario Pradal

It is certified that error appears in the above-identified patent and that said Letters Patent are hereby corrected as shown below:

In Column 1, line 34, "$F,_R$" should read -- $F_R$ --.

Column 3, line 24, "terminal" should read -- terminals --.

Column 4, line 48, "when" should read -- with --. Column 7, line 14, "aplitude" should read -- amplitude --; line 54, before "predetermined" cancel "the" and substitute -- a --.

Column 8, line 26, "voltage" should read -- voltages --; line 67, "3" should read -- e --. Column 10, line 43, before "levels" insert -- (3) voltage --.

Signed and Sealed this

Twenty-first Day of November 1978

[SEAL]

Attest:

RUTH C. MASON
Attesting Officer

DONALD W. BANNER
Commissioner of Patents and Trademarks